United States Patent
Hu et al.

(10) Patent No.: US 6,314,379 B1
(45) Date of Patent: *Nov. 6, 2001

(54) INTEGRATED DEFECT YIELD MANAGEMENT AND QUERY SYSTEM

(75) Inventors: Ding-Dar Hu, Taichung; Chwen-Ming Liu, Chiayih; Chih-Ming Huang, Hsinchu Hsien; Li-Chun Chen, Hsinchu, all of (TW)

(73) Assignee: Taiwan Semiconductor Manufacturing Company, Ltd., Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/984,882

(22) Filed: Dec. 4, 1997

(30) Foreign Application Priority Data

May 26, 1997 (TW) .................................................. 86107114

(51) Int. Cl.[7] .................................................... G06F 19/00
(52) U.S. Cl. ................................ 702/81; 702/84; 702/35; 700/110; 700/121
(58) Field of Search ........................... 702/81–84, 33–36, 702/40, 115, 117, 118, 121–123, 179, 180, 182–185, FOR 171, FOR 123, FOR 125, FOR 135, FOR 137, FOR 139, FOR 170; 700/109, 110, 115–121; 382/141, 145, 147, 149, 151; 438/14–18; 134/95.1, 95.2

(56) References Cited

U.S. PATENT DOCUMENTS

| | | | |
|---|---|---|---|
| 5,339,257 | * | 8/1994 | Layden et al. .......................... 702/84 |
| 5,542,441 | * | 8/1996 | Mohindra et al. ................... 134/95.2 |
| 5,598,341 | * | 1/1997 | Ling et al. ............................. 700/110 |
| 5,761,064 | * | 6/1998 | La et al. ................................. 700/110 |
| 5,889,674 | * | 3/1999 | Burdick et al. ....................... 700/121 |
| 5,896,294 | * | 4/1999 | Chow et al. .......................... 700/110 |

* cited by examiner

Primary Examiner—Hal Wachsman
(74) Attorney, Agent, or Firm—Pillsbury Winthrop LLP Intellectual Property

(57) ABSTRACT

An integrated defect yield management and query system for a semiconductor wafer fabrication process is disclosed. A local area network connects various testing devices for testing defect conditions of wafers, a defect yield management server and a client device. After inspection, these devices generate a plurality of process records corresponding to each of the semiconductor wafers. The defect yield management server retrieves the process records through the local area network. These process records are stored in a database divided into a plurality of fields, wherein each field corresponds to a specific defect property of the semiconductor wafers. Therefore, these acquired on-line data and their related history records can be accessed by using an inquiring interface, and the client device can effectively poll the process records stored in the database of the defect yield management server.

9 Claims, 7 Drawing Sheets

FIG. 2

Defect Library

Series code: A016     File no.:     Date: 1996, 7,15
Intiator: HLiu     File name: 60fla001

| Defect Type: SA Edge Bubble Flaking | | Step Found: SOG Curing | |
|---|---|---|---|
| Defect Code: | Case Status: Set | | |
| Technology: 50logic | Part ID: TM3332 | Lot ID: C90054 | Wafer ID: |

| Date Event Took Place: | Responsible Module Department: | | |
|---|---|---|---|
| Date Action Taken: | Contribution Source: | | |
| Date Event Solved: | Attachment: | | |
| Impact | Lots: | Wafers: | Scrap: | Yield Loss: |

Photos, Maps and EDX:

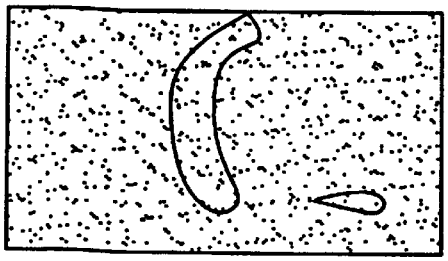 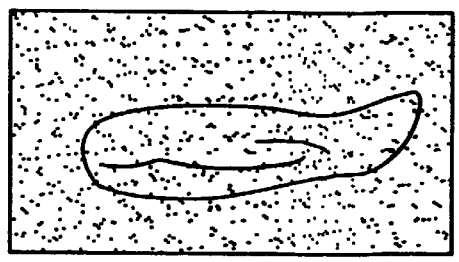

Defect Phenominon & Influence:

1. This defect is frequently seen on 0.5 Logic products after SOG_curing, the count for each wafer is around 30 to 50.

2. We found there are round spots around wafer edge which might be caused by oxide peeling. In the edge region, we found only SOG wash-line rather than SOG residue. Via cutting by FIG, the peeling oxide is compound of PEOX-SAOX-CAPOX.

Causing Reason:( )Process    ( )Equipment    ( )PM    ( )Facility
                ( )Others Action Taken and Result:
1. CVD module has modified the recipe of SAOX.
2. We added scubber clean step after SOG-curing, and thus raised yield by 20%.
Reference:

FIG. 6b

INTEGRATED DEFECT YIELD MANAGEMENT AND QUERY SYSTEM

BACKGROUND OF THE INVENTION

1. Field of the Invention

The present invention relates in general to an integrated defect yield management and query system. More specifically, the defect/yield management system can collect the results of the defect and yield analyses for semiconductor wafers and dies that are generated by scribing the wafers during or after the semiconductor wafer fabrication process, and store these results in a query database. Thereafter, analyzers can analyze various defect events according to these stored test results, to learn the defect characteristics of various process devices. In addition, the system can also integrate with in-situ particle monitor to reflect the real-time process situation.

2. Description of Related Art

In the semiconductor wafer fabrication process, defects may occur in the fabricated wafers due to operational, mechanical or chemical control errors, or the environmental uncertainty. Defects on the wafers may affect the normal operation of integrated circuits, thereby reducing the fabrication yield. Especially, since the fabrication process of the integrated circuits is increasingly complicated and the dimensions of the integrated circuits are continuously shrinking, a particle having a diameter of only 0.3 $\mu$m may cause a severe decrease in the production yield. Therefore, it is very difficult for analyzers to determine which process steps or devices may cause defects, to analyze the defect characteristics of the process devices in the production line, and to locate the defect positions on a wafer or a die.

FIG. 1 (Prior Art) schematically illustrates a defect analysis flowchart in a conventional semiconductor wafer fabrication process. As shown in FIG. 1, the defect analysis process may be roughly divided into two portions: an in-line process defect control portion (shown in the left part of FIG. 1) and an off-line defect analysis portion (shown in the right part of FIG. 1). In the in-line process defect control portion, semiconductor wafers are tested after particular process steps, such as a diffusion/thin film process 11, a photolithography process 12 or an etching process 13. During these processing steps, the semiconductor wafers may become defective in their bulk or on their surface due to uncertain process environments. Therefore, after these process steps, an inspection step after developer/etching/deposition (AD/EI) 20 is performed to examine the processed wafers by thoroughly inspecting a part of these semiconductor wafers or by scanning. Depending upon the particular defect condition noted during the inspection step 20, process parameters in the production line may be changed to reduce the likelihood of further defects occurring. Then, based on the inspection results, an image-capturing inspection 30 of the semiconductor wafers is performed to obtain an image showing the sharpness and the composition of defects by optical microscopes, Scanning Electron Microscope (SEM) and element dispersion spectrum. These test results acquired by the in-line inspection steps are immediately sent to a defect management system 10, which can classify and preserve these test results for subsequent analyses.

Once the entire semiconductor manufacturing process is complete, processed semiconductor wafers are analyzed off-line for defects. These off-line defect analyses include a wafer acceptance test/specification (WAT/SPC) 40, a quality control (QC) examination 50, a Circuit Probing/Final Test (CP/FT) yield test 60 and a reliability step 70. The WAT/SPC step 40 is used to examine the electrical characteristics of the wafers under test by suitable devices. The QC examination 50 is used to visually examine the appearance of the wafers undergoing testing, to decide whether the extant number of defects meets the customer requirements. Then, the CP/FT yield test 60 is used to estimate the process yield. At this time, the wafers are scribed into a plurality of dies and the final test is finished based on dies. Finally, the reliability test 70 is performed under various test conditions. Conventionally, although the QC examination 50, the CP/FT yield test 60 and the reliability test 70 all are used to analyze visible and invisible defects of the semiconductor wafers, the results acquired through these tests are sent to different departments of the production line to be analyzed. For example, the results acquired by the QC examination 50 and the reliability test 70 are passed to the quality control (QC) department, and the results of the reliability test 60 are sent to the product department. Thus, in a conventional defect analysis system, various defect-related data were distributed to different individual departments. Therefore, it is very difficult to deal with a specific defect event as a whole. In addition, historical defect records are also difficult to maintain.

Furthermore, the conventional process defect management system can not combine the in-situ monitoring equipment, such as particle monitors for controlling the particle number in the fabrication environment, with other in-line or off-line testing devices. In other words, the above-indicated in-situ control data can not be integrated with the in-line test data and the off-line test data. Therefore, it is difficult to provide a complete set of defect-related information for further and real-time analyses. In addition, personnel on the production line can not identify the defect causes in time, and, therefore, an improvement of the production yield is not apparent.

Furthermore, the defect-related information is distributed over the whole production line, and can not be acquired by a simpler interface for the analyzers and the personnel on the production line. This reduces the efficiency of the defect analyses.

SUMMARY OF THE INVENTION

Therefore, an object of the present invention is to provide an integrated process defect/yield management and query system, which can harmonize and merge test data acquired by in-line process defect control analyses (such as After developing Inspect (ADI), After Etching Inspect (AEI) and defect inspection), off-line defect/yield analyses (such as visual inspection, yield test and reliability analysis) and in-situ particle monitoring, to create and preserve a complete set of defect-related data and historical defect event records.

Another object of the present invention is to provide an integrated defect/yield management and query system, which can provide an inquiry interface by which to search for a complete set of defect-related data, thereby improving the efficiency of data analysis, and reduce the data-polling time.

The present invention achieves the above-indicated objectives by providing an integrated defect yield management and query system for total quality control of the semiconductor wafer fabrication process. A local area network is used to connect all the devices for testing and inspecting the defect condition of the fabricated semiconductor wafers, a defect yield management server and a client device. These test devices are used to analyze process defects and process yields of semiconductor wafers during the fabrication process and after the fabrication process. After inspection, these devices may provide a plurality of process records corresponding to each of the semiconductor wafers, respectively. The defect yield management server retrieves the process records according to a communication protocol of the local area network, such as the popular Transmission Control Protocol/Internet Protocol (TCP/IP). These process records are stored in a database divided into a plurality of data fields, wherein each field represents a specific defect property of the semiconductor wafers. Therefore, the acquired data can be organized and easily accessed. Through a simple and convenient inquiry interface, the client device can effectively demand the process records stored in the database of the defect yield management server.

Various other objects, advantages and features of the present invention will become readily apparent from the ensuing detailed description, and the novel features will be particularly pointed out in the appended claims.

BRIEF DESCRIPTION OF THE DRAWINGS

The following detailed description, given by way of example are not intended to limit the invention solely to the embodiments described herein, will best be understood in conjunction with the accompanying drawings, in which.

DETAILED DESCRIPTION OF THE PREFERRED EMBODIMENT

The integrated process defect/yield management and query system in the present invention can merge and organize test data acquired by in-line process defect control analyses (such as ADI, AEI and defect inspection), off-line defect/yield analyses (such as visual inspection, yield test and reliability analysis) and in-situ particle monitoring, for completely preserving defect analysis data and historical defect event records. The system also provides an inquiry interface that can locate a complete set of defect-related data for specific defect events and transfer them to the analyzers and the personnel on the production line and in the office. The preferred embodiment of the present invention is described in detail below.

Figure 1:
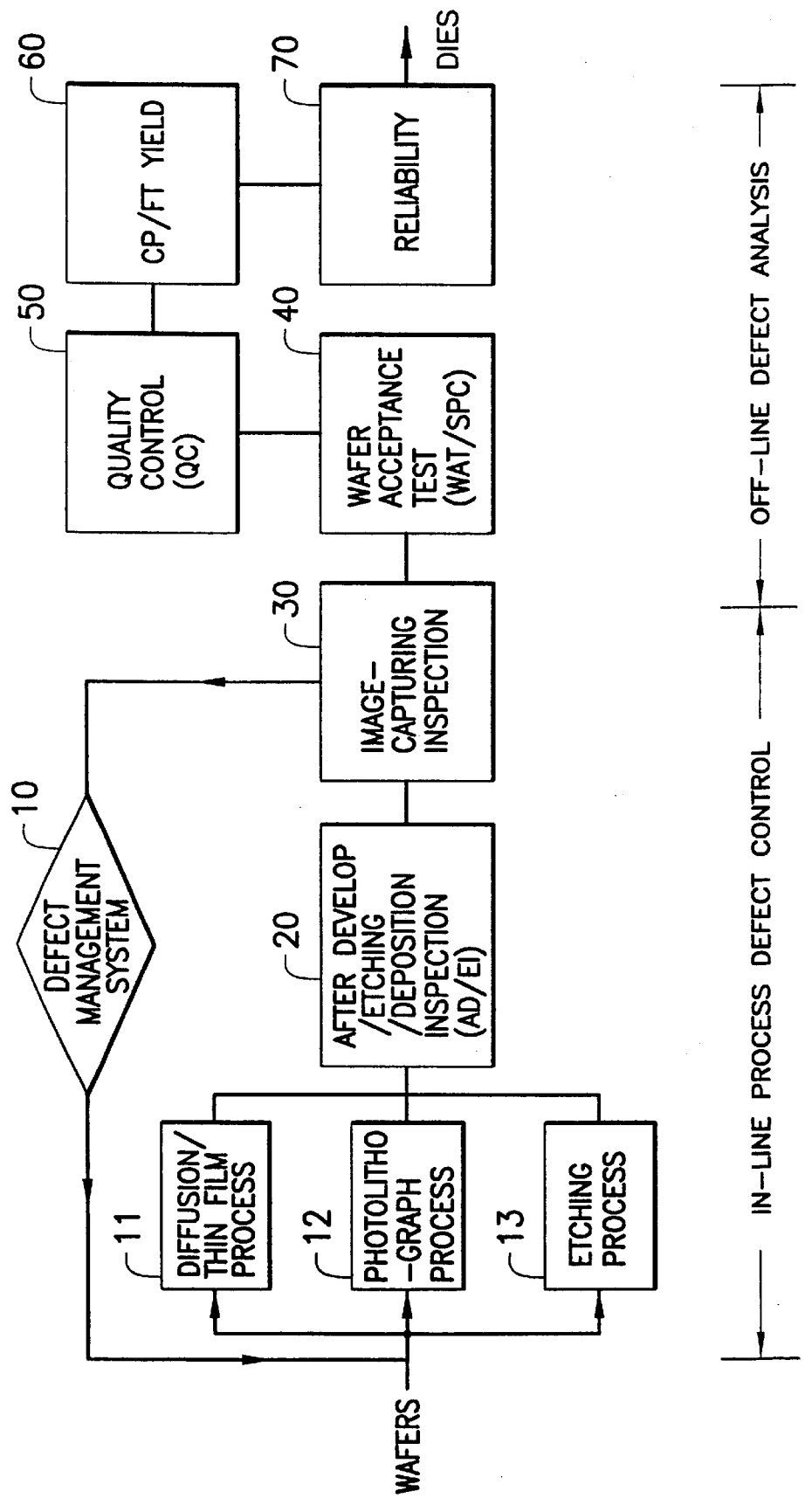
FIG. 1 (PRIOR ART) schematically illustrates a defect analysis flowchart in a conventional semiconductor wafer fabrication process.
Figure 2:
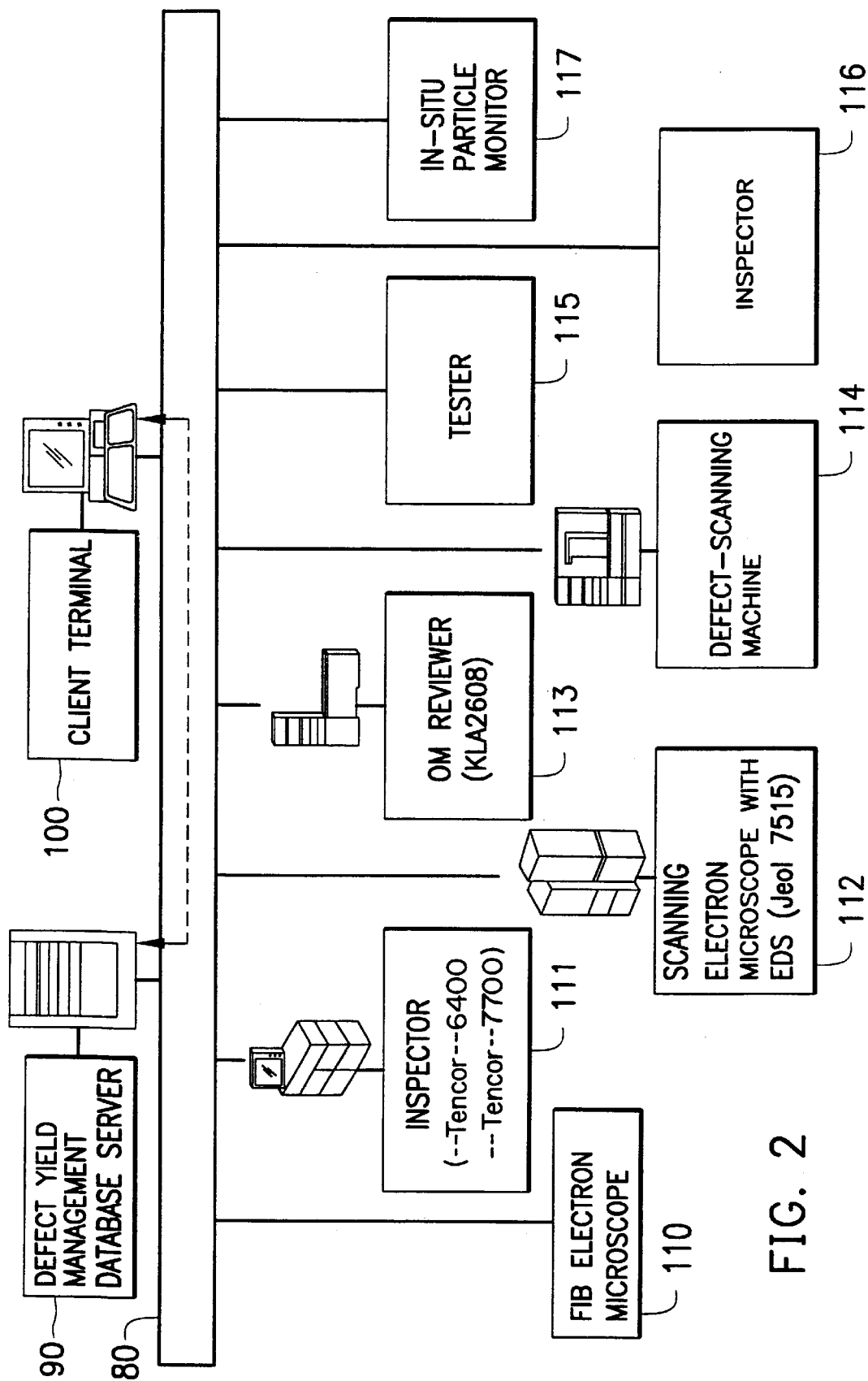
FIG. 2 shows the configuration of the integrated process defect yield management and query system according to the embodiment of the present invention.

FIG. 2 shows the configuration of the integrated process defect/yield management and query system according to the preferred embodiment of the invention. All process records generated by the various test and measurement devices (Focused Ion Beam (FIB), electron microscope 110, inspector 111, scanning electron microscope with EDS 112, OM reviewer 113, defect-scanning machine 114, tester 115, inspector 116, and in-situ particle monitor 117) shown in FIG. 2 are output through the local area network 80. The local area network 80 connects the defect yield management database server (hereafter abbreviated as DYMS) 90, and devices 110~117 for analyzing process defects and process yields of semiconductor wafers, with a client terminal 100. In this embodiment, the devices for analysing process defect and process yields includes a Focused Ion Bean (FIB) electronic microscope 110, an inspector (such as a Tensor 6400/7700) 111, a scanning electron microscope with EDS (such as Jeol 7515) 112, Optical Microscope (OM) reviewer (such as KLA2608) 113, a defect-scanning device (such as KLA21XX) 114, a tester 115, an ADI/AEI/QC inspector 116 and an in-situ particle monitor 117. These devices may examine the semiconductor wafers and the dies generated by scribing the wafers in an in-line or off-line manner. The test results may be transferred to DYMS 90 via the local area network 80. Note that the analyzing devices 110~117 are illustrated for reference purpose and are not intended to limit the scope of the invention. For example, a composition analysis device (such as Noran) also can be used in the process. Defect/yield analysis devices connected to the local area network 80 include in-line defect control devices, in-situ particle monitoring equipment and off-line defect/yield analysis devices.

Figure 3:
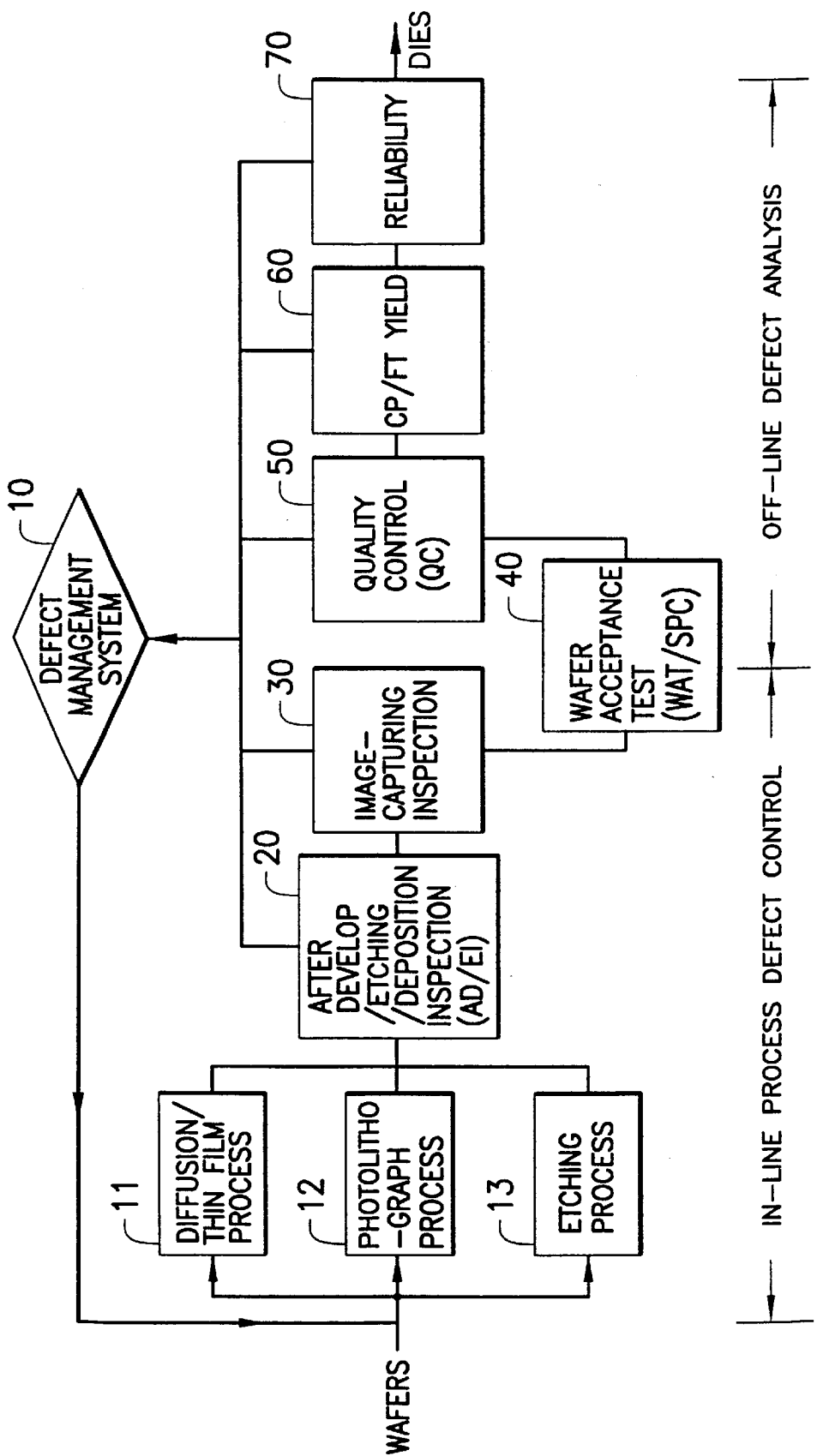
FIG. 3 schematically illustrates a defect analysis flowchart in the integrated process defect yield management and query system according to the present invention.

FIG. 3 schematically illustrates a defect analysis flowchart in the integrated process defect yield management and query system of the embodiment. The in-line defect control devices are used to perform defect analyses on the semiconductor wafers during the semiconductor wafer fabrication process. The in-line defect control devices include an after developer/etching/deposition (AD/EI) inspector 20 and an image-capturing devices 30. The AD/EI inspector 20 is used to scan the surface of the semiconductor wafers that are processed by an photolithography and etching step to locate the defects after the photolithography and etching step. The image-capturing equipment 30 is used to capture an image of the surface of the semiconductor wafers undergoing testing, providing imaging information about the defects in the semiconductor wafers.

The off-line defect/yield analysis devices are used to perform process defects and process yields analyses on the wafers or the dies after the semiconductor wafer fabrication process. In FIG. 3, the off-line defect/yield analysis devices include a WAT/SPC test device 40, a QC examination device 50, a CP/FT yield test device 60 and a reliability test device 70. The WAT/SPC test device 40 is used to test the electrical characteristics of the fabricated semiconductor wafers. The QC examination device 50 is used to visually audit the appearance of the fabricated semiconductor wafers and count the number of the process defects on the semiconductor wafers, which decides whether the quality of the fabricated wafer meets the customer requirement or not. The CP/FT yield test device 60 performs a circuit probing analysis on the fabricated wafers. The final test examines the die yield after scribing and package. The reliability test device 70 performs a reliability analysis on the dies under a specified test condition. For example, the reliability test device 70 can estimate the lifetime of the die under test at a specific temperature and at a specific humidity.

In addition, the in-situ particle monitor 117 is used to monitor the particle number of the environment and the equipment on the production line and control the particle condition during the semiconductor wafer fabrication process. The particle condition is correlated with process defects and may reduce the process yield. Such a monitoring process must be continuous to acquire real-time information about the particle condition.

DYMS 90 collects all test data generated by the inspectors 20, the image-capturing equipment 30, the WAT/SPC test device 40, the QC examination device 50, the CP/FT yield test device 60 and the reliability test device 70.

Figure 4:
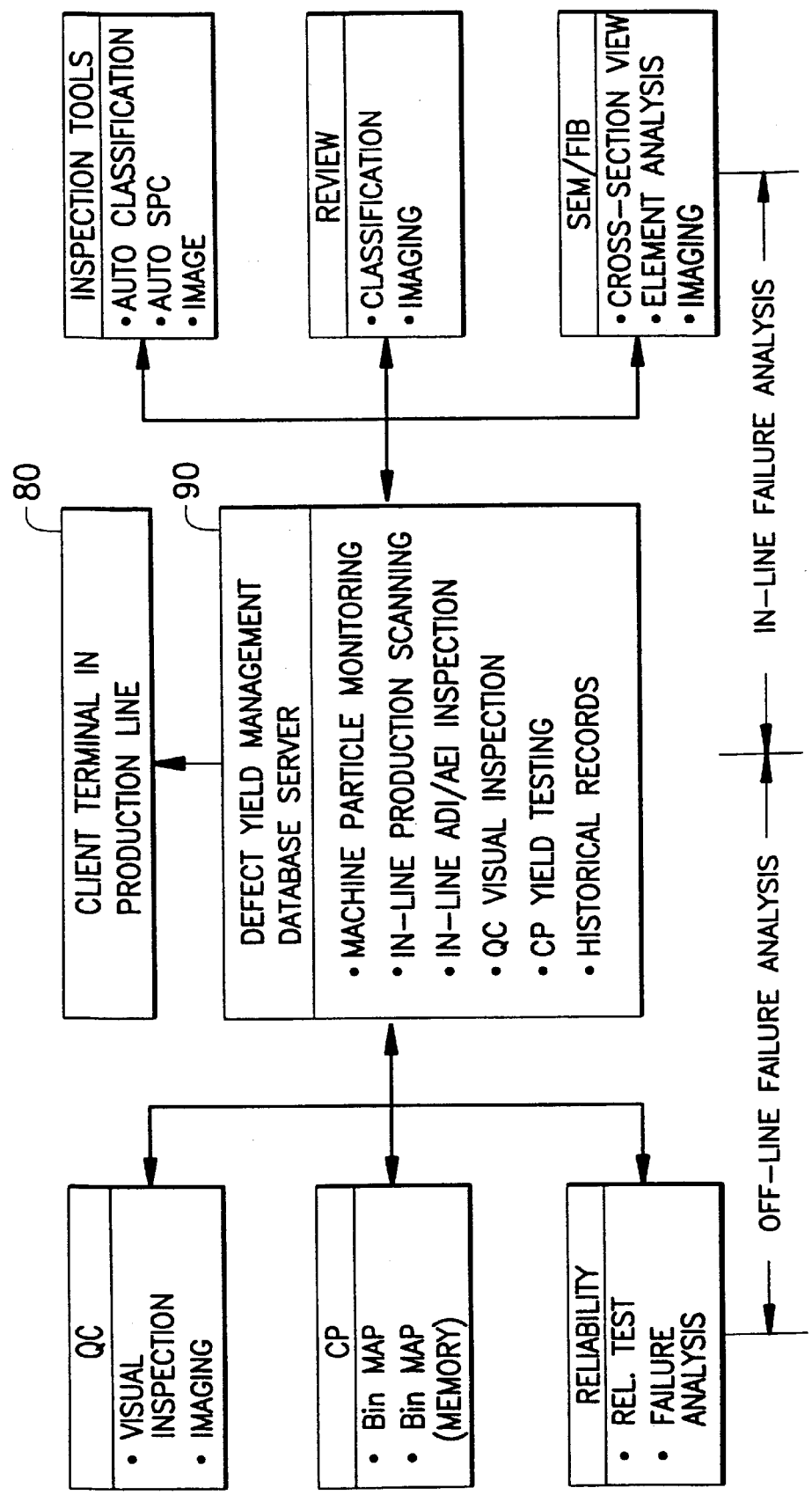
FIG. 4 shows a data-retrieval diagram according to the embodiment of the present invention.

FIG. 4 shows a data-retrieving process diagram for this embodiment. In the data-retrieving process, DYMS 90 continuously collects the test data generated by all the defect/yield analysis devices via the local area network 80. For the in-line failure analysis, general inspection tools can provide information about auto-classification, auto-specification review and images. Review stations can provide information about classification and imaging. SEM/FIB electronic microscopes can provide cross-sectional views, element analysis and secondary electron images of the wafers. For the off-line failure analysis, the QC analysis can provide data about the visual inspection and images, the CP/FT analysis can provide a BIN map (showing the defect location on the wafer) and a BIT map (showing the defect location on the memory device), and the reliability analysis can provide the results of the reliability test and the failure analysis.

As described above, the data passed to the DYMS 90 via the local area network 80 may be categorized into three groups: data generated by the in-line defect control equipment, data generated by the off-line defect/yield analysis equipment and data generated by the in-situ particle monitoring equipment. Therefore, the DYMS 90 can maintain the following information: data generated by device particle monitoring, in-line production scanning, in-line ADI/AEI inspection, QC visual inspection, CP yield testing and historical records. Similarly, the historical records and the current process records preserved in the DYMS 90 may also be accessed by the client terminal 100 through the local area network 80.

The defect-related data stored in a database of the DYMS 90 are retrieved from various defect/field analysis equipments. The database of the DYMS 90 can be polled by the client terminal 100 to provide the required defect-related or yield-related information. Therefore, the DYMS 90 must organize all retrieved data to improve the efficiency of data-searching. In this embodiment, the database in the DYMS 90 has been divided into eight data fields. These data fields include (1) a defect information data field, which contains information about the defect number on a specific material layer, for example, a dielectric layer or a gate polysilicon layer; (2) a defect image data field, which contains the true images of the defects; (3) a defect map data field, which contains the position distribution of the defects; (4) an ADI/AEI image field, which contains images captured by the ADI/AEI analysis; (5) an energy dispersive spectrum data field, which provides data about the energy-related information of the defects for judging the material; (6) a QC/AOQ data field, which contains information about how many sites have failed within a specified period, for example, within one month; (7) a BIN map data field, which contains BIN maps indicating the number and the location distribution of the defects on a wafer under test; and (8)a BIT map data field, which contains BIT maps indicating the failure number and the exact location distribution of the defects on a memory chip. However, the total number and the classification of the data fields described above are not intended to limit the scope of the invention. It is understood by those skilled in the art that the total number and the classification of the data fields may be modified according to the practical defect/yield analysis devices in use and the data structure required by users.

According to a query requirement, a user can poll the database provided by the DYMS 90 for related information about the analysis results. Therefore, each item in the data fields must have a tag attached to serve as a searching index. In this embodiment, each data item has three types of index tags. The first one is a device-related tag, which marks the process devices generating the related process record. The device-related tag can be used to analyze the in-process defect characteristics of a specific process device. The second one is a wafer lot tag, which marks the wafer lot (batch) generating the related process record. The third one is a defect event tag, which indicates a defect analysis data item with respect to a specific defect event. However, the tag number and the tag types described above are not intended to limit the scope of the invention. It is understood by those skilled in the art that the tag number and the tag types may be modified according to the required data analysis.

Figure 5:
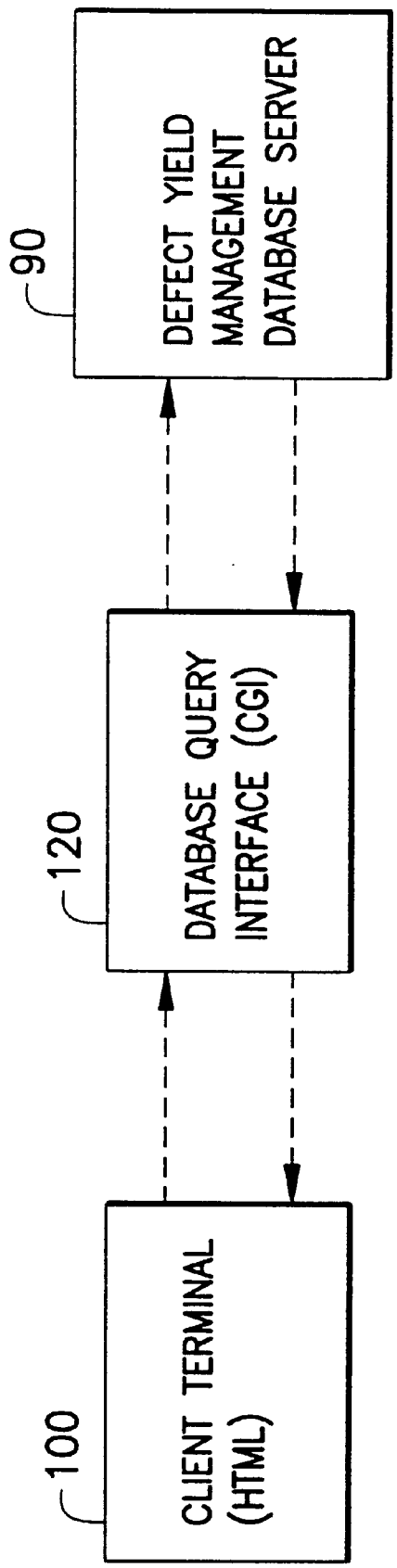
FIG. 5 shows a data-polling diagram according to the embodiment of the present invention.

FIG. 5 is a block diagram showing the process of polling according to the preferred embodiment of the present invention. In hardware terms, the client terminal 100 is connected to the DYMS 90 by means of the local area network 80. In terms of communication, client terminal 100 polls the database of the DYMS 90 by means of a database query interface 120 using the Transmission Control Protocol/Internet Protocol (TCP/IP). In this embodiment, the database query interface 120 is implemented by the Common Gate Interface (CGI). Therefore, client terminal 100 can utilize an inquiry page written in the HyperText Markup Language (HTML), through the CGI program provided by the database query interface 120, to poll the DYMS 90. Such engine is used for quick data finding. After searching the database, DYMS 90 can transfer the located defect-related or yield-related data back to client terminal 100. Query items that are used as searching keywords may be the device-related tag, the wafer lot tag and the defect event tag, as described above. Therefore, users can easily and completely acquire the related analysis data. However, the data inquiry and transfer mechanisms described above are not intended to limit the scope of the invention. It is understood by those skilled in the art that other data inquiry and transfer schemes may be adopted to achieve the purposes of the present invention.

Figure 6A:
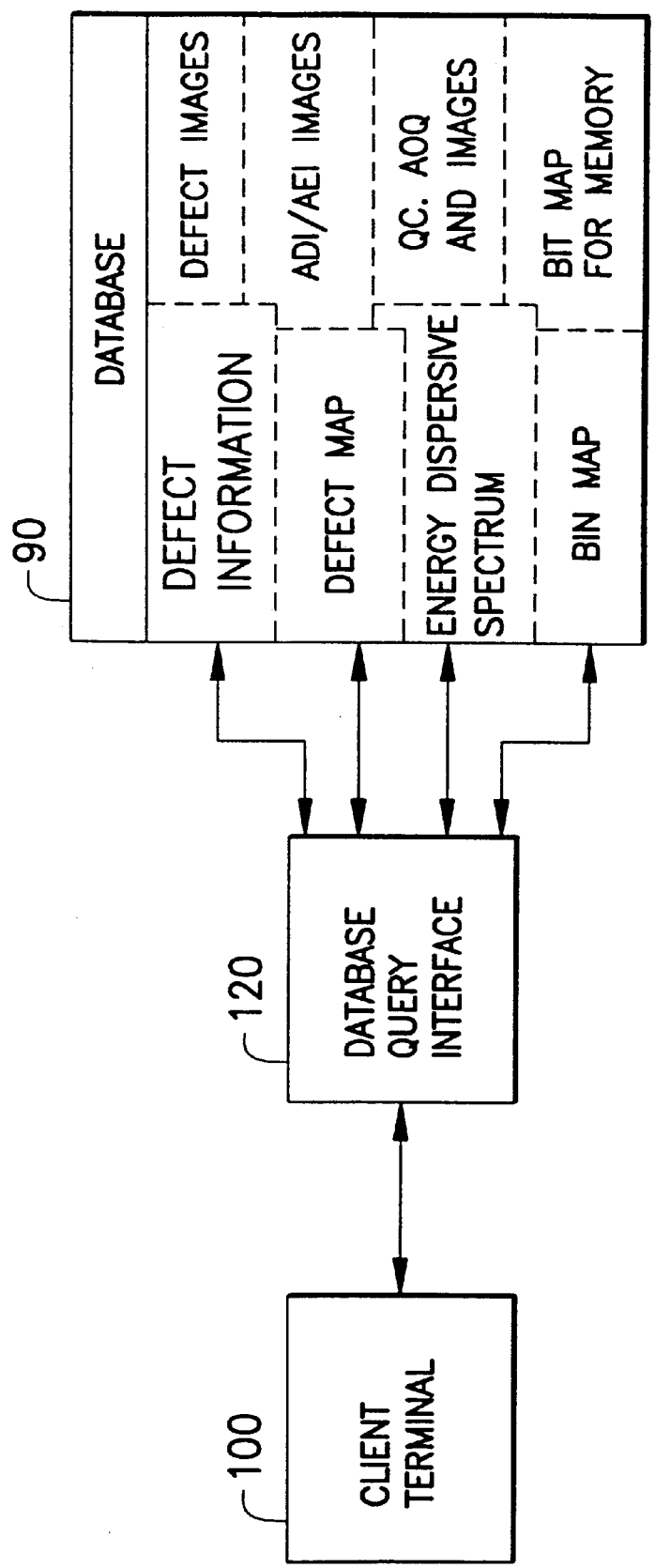
FIG. 6a shows an example of the data-polling process in the embodiment of the present invention, FIG. 6b show an example of the display appearing on the client terminal.

FIG. 6a is an example of the data-polling process of the preferred embodiment, and FIG. 6b shows an example of the display appearing on the client terminal 100. In this example, users poll the database in the DYMS 90 by using items "Lot related record" and "Defect Types" as searching indexes by means of the database query interface 120. DYMS 90 retrieves corresponding data from the data fields of "defect information", "defect images", "defect map", "ADI/AEI images", "energy dispersive spectrum", "QC, AOQ and images", "BIN map" and "BIT map for memory" in response to the inquiry and returns these data to the client terminal 100 by means of the database query interface 120, as shown in FIG. 6a. Therefore, users can easily acquire the required analysis data through an easy-to-use inquiry interface in the present invention.

The foregoing description of preferred embodiments of the present invention has been provided for the purpose of illustration and description. It is not intended to be exhaustive or to limit the invention to the precise forms disclosed. Many modifications and variations will be apparent to practitioners skilled in this art. The embodiments were chosen and described to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. An integrated defect yield management and query system for a semiconductor fabrication process, comprising:

a local area network having a communication protocol;

devices connected to the local area network, for analyzing process defects and process yields of semiconductor wafers during and after the semiconductor fabrication process and providing process records corresponding to the semiconductor wafers, and for monitoring and controlling particle numbers in a semiconductor fabrication environment;

a defect yield management server, connected to the local area network, for retrieving the process records generated by the analyzing devices through the communication protocol of the local area network, the defect yield management server having a database storing the process records retrieved from the analyzing devices and history records, each of the process records and the history records having fields corresponding to specific defect characteristics of the semiconductor wafers; and a client device, connected to the local area network, for polling the process records and the history records stored in the database of the defect yield management server.

2. The integrated defect yield management and query system of claim 1, wherein the analyzing devices include:

in-line devices for detecting the process defects of the semiconductor wafers during the semiconductor fabrication process;

off-line devices for detecting process defects and process yields of dies generated by scribing the semiconductor wafers after the semiconductor fabrication process; and an in-situ particle monitor for monitoring and controlling a particle condition during the semiconductor fabrication process.

3. The integrated defect yield management and query system of claim 2, wherein the in-line devices include:

a device for scanning the process defects of the semiconductor wafers after a wafer-processing step; and a device for capturing an image of the surface of the semiconductor wafers.

4. The integrated defect yield management and query system of claim 2, wherein the off-line devices include:

a device for auditing the appearance of the semiconductor wafers and counting the number of the process defects on the semiconductor wafers;

a device for performing a yield analysis on the dies used in the semiconductor fabrication process; and a device for analyzing the reliability of the dies.

5. The integrated defect yield management and query system of claim 1, wherein the communication protocol of the local area network is the transmission control protocol/internet protocol (TCP/IP).

6. The integrated defect yield management and query system of claim 1, wherein the client device polls the process records and the history records stored in the database of the defect yield management server through an interface written in the hypertext markup language, the interface providing a plurality of query items for the fields of the process records and the history records.

7. The integrated defect yield management and query system of claim 1, wherein each of the fields of the process records and the history records has a tag related to the corresponding analyzing device that can be searched as a keyword.

8. The integrated defect yield management and query system of claim 1, wherein each of the process records and the history records stored in the database has a tag for indicating a lot number pertaining to the corresponding semiconductor wafer that can be searched as a keyword.

9. The integrated defect yield management and query system of claim 1, wherein each of the fields of the process records and the history records stored in the database has a tag related to a defect event that can be searched as a keyword.

* * * * *